(12) United States Patent
Takahashi (10) Patent No.: US 8,288,925 B2
(45) Date of Patent: Oct. 16, 2012

(54) METHOD OF MANUFACTURING QUARTZ RESONATOR ELEMENT, QUARTZ RESONATOR ELEMENT, QUARTZ RESONATOR, AND QUARTZ OSCILLATOR

(75) Inventor: Takehiro Takahashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 519 days.

(21) Appl. No.: 12/556,717

(22) Filed: Sep. 10, 2009

(65) Prior Publication Data

US 2010/0066213 A1    Mar. 18, 2010

(30) Foreign Application Priority Data

Sep. 17, 2008 (JP) ................... 2008-238525

(51) Int. Cl.
*H01L 41/08* (2006.01)
(52) U.S. Cl. ........ 310/363; 310/364; 310/344; 29/25.35
(58) Field of Classification Search .......... 310/364, 310/344, 363; 29/25.35
See application file for complete search history.

(56) References Cited

U.S. PATENT DOCUMENTS

| | | | |
|---|---|---|---|
| 7,129,624 B2 | 10/2006 | Umeki et al. | |
| 7,463,117 B2 * | 12/2008 | Ohara et al. | 333/187 |
| 7,579,762 B2 | 8/2009 | Takahashi | |
| 7,795,789 B2 * | 9/2010 | Schuh | 310/364 |
| 2005/0151450 A1 | 7/2005 | Umeki et al. | |
| 2008/0157630 A1 | 7/2008 | Takahashi | |
| 2008/0211350 A1 * | 9/2008 | Tanaya et al. | 310/328 |
| 2009/0268776 A1 * | 10/2009 | Koyama | 374/119 |
| 2010/0043547 A1 * | 2/2010 | Okamoto et al. | 73/504.16 |
| 2010/0079038 A1 * | 4/2010 | Jeon et al. | 310/364 |
| 2011/0064615 A1 * | 3/2011 | Watanabe et al. | 422/69 |
| 2011/0316392 A1 * | 12/2011 | Jeon et al. | 310/364 |

FOREIGN PATENT DOCUMENTS

| | | |
|---|---|---|
| JP | 56096071 A * | 8/1981 |
| JP | 2002-050937 | 2/2002 |
| JP | 2003-224442 | 8/2003 |
| JP | 2005-136575 | 5/2005 |
| JP | 2005-203858 | 7/2005 |
| JP | 2006-050508 | 2/2006 |
| JP | 3930531 | 6/2007 |

(Continued)

*Primary Examiner* — J. San Martin
(74) *Attorney, Agent, or Firm* — Jordan and Hamburg LLP (57) ABSTRACT

To provide a method of manufacturing a quartz resonator element having a small CI value, a quartz resonator element manufactured by this method, a quartz resonator, and a quartz oscillator.

In a method of manufacturing a quartz resonator element in which on a surface of a plate-shaped quartz piece, a thin film-shaped electrode in order to excite the quartz piece is provided, a first metal layer that is composed of chromium and whose thickness is not less than 20 Å nor more than 45 Å is formed on the surface of the quartz piece (P4), and next, a second metal layer that is composed of gold or silver and whose thickness is not less than 500 Å nor more than 950 Å is formed on an upper surface of the first metal layer (P5), and then, the electrode made up of the first metal layer and the second metal layer is provided (P6). Thereafter, a quartz substrate on which the electrode is formed is heated at a temperature range of not less than 200° C. nor more than 400° C., and the chromium composing the first metal layer is diffused into the second metal layer (P7).

8 Claims, 5 Drawing Sheets

FOREIGN PATENT DOCUMENTS

| | | |
|---|---|---|
| JP | 2008-035137 | 2/2008 |
| JP | 2008-085997 | 4/2008 |
| JP | 2008-166510 | 7/2008 |
| WO | WO-01/67600 | 9/2001 |
| WO | WO-01/067600 | 9/2001 |

* cited by examiner

Fig. 1

(a) FRONT SURFACE (b) REAR SURFACE

METHOD OF MANUFACTURING QUARTZ RESONATOR ELEMENT, QUARTZ RESONATOR ELEMENT, QUARTZ RESONATOR, AND QUARTZ OSCILLATOR

BACKGROUND OF THE INVENTION

1. Field of the Invention

The present invention relates to a method of manufacturing a quartz resonator element in which on a quartz piece, a thin film-shaped electrode in order to excite the quartz piece is provided, a quartz resonator element, a quartz resonator, and a quartz oscillator.

2. Description of the Related Art

A quartz resonator element is an element constituted by a quartz piece and thin film-shaped electrodes each provided on both surfaces of the quartz piece, and is widely used for an electronic component of a quartz oscillator or the like as a reference source of a frequency or time by using a characteristic in which oscillation is excited by an inverse piezoelectric effect of quartz when a voltage is applied to the electrodes.

Figure 1:
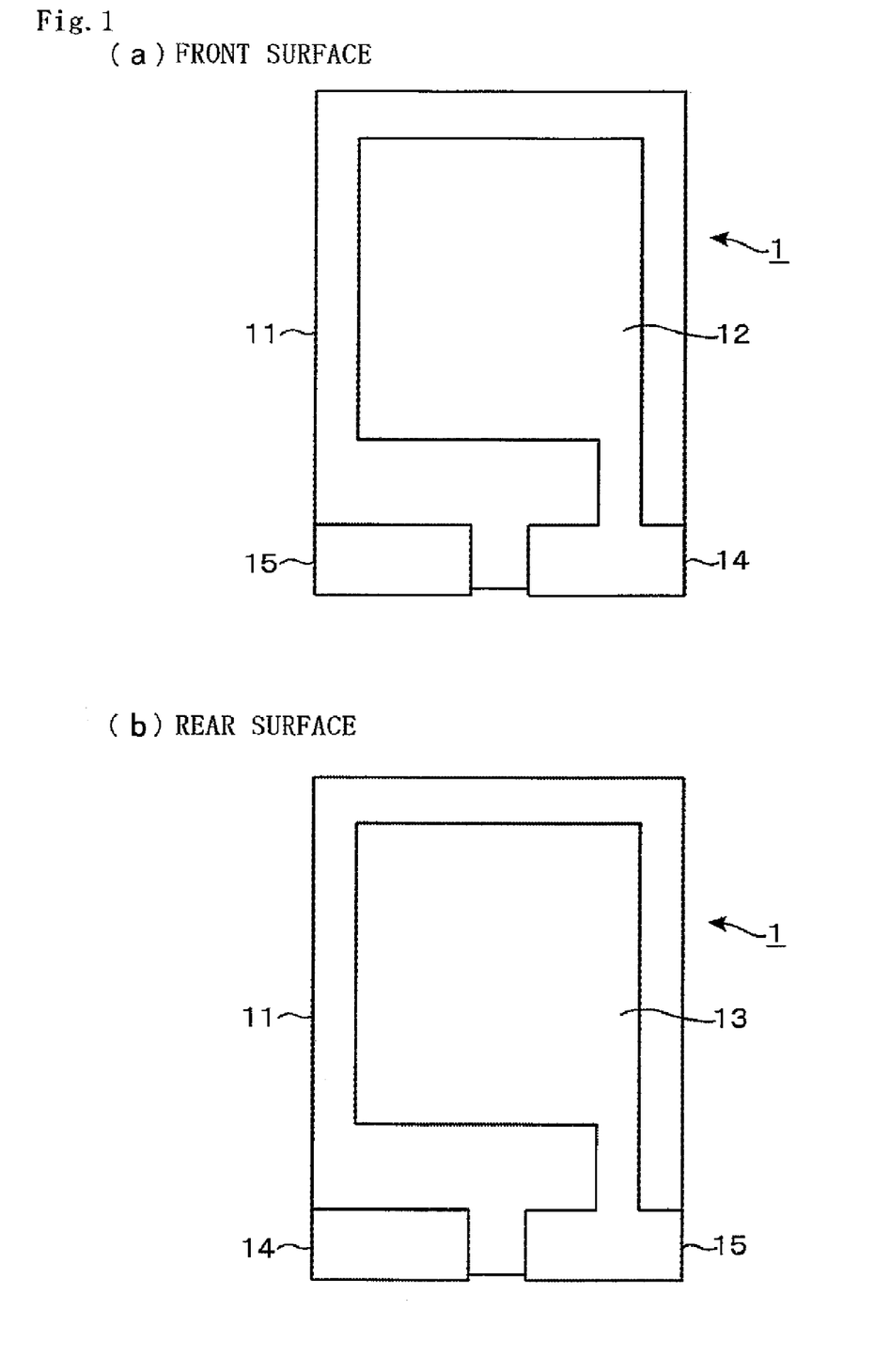
FIG. 1(a) and FIG. 1(b) are plan views showing external structures of an AT cut quartz resonator element.

As external structures of a front surface side and a rear surface side are illustrated in FIG. 1(a) and FIG. 1(b), a rectangular quartz resonator element 1 using, for example, an AT cut quartz piece is constituted such that thin film-shaped electrodes are provided on both front and rear surfaces of a quartz piece 11 cut into a thin rectangular shape. Hereinafter, when an upper side is taken as a tip side and a lower side is taken as a base end side in FIG. 1(a) and FIG. 1(b), for example, rectangular excitation electrodes 12 and 13 are formed so as to face to each other via the quartz piece 11 in respective central regions close to tips on the both front and rear surfaces of the quartz piece 11. On the other hand, on base end portions of the quartz piece 11, for example, long rectangular lead electrodes 14 and 15 are provided separately from each other, and each of the lead electrodes 14 and 15 is formed on the both front and rear surfaces of the quartz piece 11 to stride over a side surface of the base end side of the quartz piece 11, for example. In this example, the excitation electrode 12 on the front surface side is connected to the lead electrode 14, and the excitation electrode 13 on the rear surface side is connected to the lead electrode 15.

Figure 2:
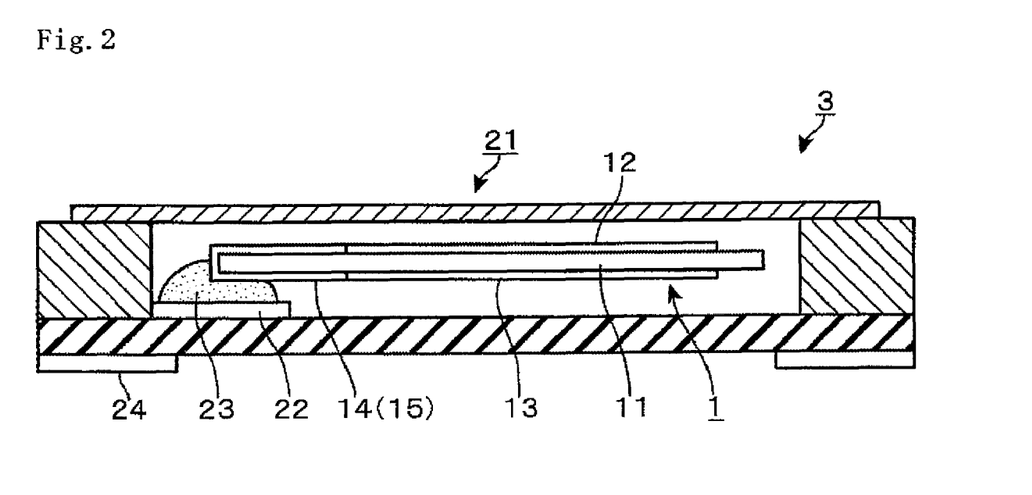
FIG. 2 is a vertical cross-sectional view of a quartz resonator provided with the quartz resonator element.

FIG. 2 is a vertical cross-sectional view of a quartz resonator 2 in which the quartz resonator element 1 is stored in a package 21 being a surface mount-type receptacle. The package 21 is constituted as, for example, a flat casing provided with a rectangular plane shape that is one size larger than the quartz resonator element 1, and two electrodes 22 are provided separately from each other along, for example, one side of a rectangular bottom surface in the package 21. These electrodes 22 are connected electrically to an electrode 24 being a terminal portion provided on a bottom portion of an outside of the package 21. For example, the lead electrodes 14 and 15 formed on the base end portion of the rear surface side adhere to the two electrodes 22 respectively via, for example, a conductive adhesive 23, and thereby, the quartz resonator element 1 is fixed in the package 21 in a cantilever manner, and is connected to these electrodes 22 electrically. When this quartz resonator 2 is combined with an oscillation circuit and a voltage is supplied thereto, the quartz resonator element 1 is oscillated, and a frequency signal can be taken out from the electrode 24 being the terminal portion.

Here, in general, for the thin film-shaped electrodes constituting the excitation electrodes 12 and 13 and the lead electrodes 14 and 15, a metal such as gold or silver, which has small electrical resistance, is excellent in corrosion resistance, and has a relatively small oscillation loss (a CI (crystal impedance) value) when converting electric energy into oscillation energy, is used. However, the metal has weak adhesion to the quartz piece 11. Therefore, chromium having good adhesion to the quartz resonator element 1 is formed on the quartz resonator element 1 as a first metal layer, and then, thin films composed of gold or silver are formed on upper surfaces of the first metal layers as a second metal layer, resulting that a two layer structure is made. Thereby, adhesion of the electrodes 12 to 14 is improved (for example, Patent Documents 1 and 2).

Further, in the electrodes 12 to 14 having the above-described two layer structure, chromium has high adhesion to the conductive adhesive 23 compared with gold or silver, and therefore, a heat treatment in which the quartz resonator element 1 where the electrodes 12 to 14 are formed is heated to, for example, approximately 300° C. to diffuse the chromium of the first metal layer into an inside of the gold or the silver of the second metal layer is performed. The chromium is diffused into surfaces of the lead electrodes 14 and 15 by this treatment, and thereby, adhesion between the electrodes 12 to 14 and the conductive adhesive 23 can also be improved.

However, the present inventor has understood that chromium has large electrical resistance compared with gold or silver, and therefore, all of the electrical resistances of the electrodes 12 to 15 rise higher than those before the heat treatment is performed by the chromium being diffused into the metal. When the electrical resistances of the electrodes 12 to 15 become large, the CI value of the quartz resonator element 1 rises to thereby increase power consumption.

As for the above point, the second metal layer composed of gold or silver is relatively thickened to the first metal layer to suppress concentration of the chromium to be diffused into the second metal layer low, thereby enabling the rise in the electrical resistances of all of the electrodes 12 to 15 to be suppressed, but it is not advisable to thicken the metal layer of gold or silver because a manufacturing cost of the quartz resonator element 1 is increased.

Further, in recent years, a demand for the quartz resonator 2 having a high frequency increases, and the higher frequency the quartz resonator element 1 has, the thinner the quartz piece 11 needs to be. Therefore, in the case of the quartz resonator 2 having a high frequency of, for example, 50 MHz to 100 MHz, a thickness of the quartz piece 11 is thinned to, for example, approximately 33 μm to 16 μm. However, when the heat treatment is performed as is described already for the electrodes having the two layer structure provided on the quartz piece 11 that is thin as above, a frequency characteristic of the quartz resonator element 1 changes before and after the heat treatment due to a reason of stress exerted on the quartz piece 11 in the heat treatment or the like. Therefore, a desired oscillation frequency cannot be obtained, resulting that there is a problem that frequency adjustment is required again.

Note that arts described in Patent Documents 1 and 2 do not pay attention to a problem that the CI value is increased due to the diffusion of the chromium composing the first metal layer into the second metal layer, and further each electrode has a three layer structure to a four layer structure as a whole and a film of the whole electrode is thick, resulting that the problem that the frequency characteristic changes before and after the heat treatment due to thinning of the quartz piece 11 cannot be solved.

PATENT DOCUMENT 1

Japanese Patent Application Laid-open No. 2002-50937: claim 7, paragraph 0087, FIG. 11

PATENT DOCUMENT 2

Domestic Re-Publication of PCT International Publication for Patent Application 01/067600: page 10 lines 9 to 13, page 11 lines 8 to 11, page 12 lines 17 to 22, and page 13 lines 16 to 21

SUMMARY OF THE INVENTION

The present invention is made based on such circumstances, and an object thereof is to provide a method of manufacturing a quartz resonator element having a small CI value, a quartz resonator element manufactured by this method, a quartz resonator, and a quartz oscillator.

A method of manufacturing a quartz resonator element according to the present invention is a method of manufacturing a quartz resonator element in which on a surface of a plate-shaped quartz piece, a thin film-shaped electrode in order to excite the quartz piece is provided, the method is characterized in that it includes:

a step of forming a first metal layer that is composed of chromium and whose thickness is not less than 20 Å nor more than 45 Å on the surface of the quartz piece;

a step of forming a second metal layer that is composed of gold or silver and whose thickness is not less than 500 Å nor more than 950 Å on an upper surface of the first metal layer, and providing the electrode made up of the first metal layer and the second metal layer; and a step of heating a quartz substrate on which the electrode is formed to a temperature range of not less than 200° C. nor more than 400° C., and diffusing the chromium composing the first metal layer into the second metal layer. Here, a thickness of the quartz piece is preferable to be not less than 1 μm nor more than 100 μm.

Further, a quartz resonator element according to the present invention is characterized in that it is manufactured by the above-described manufacturing method, and this quartz resonator element constitutes a quartz resonator including a receptacle in which the quartz resonator element is closed airtightly and a terminal portion provided on an outside of this receptacle and connected to the electrode electrically, and a quartz oscillator including the quartz resonator element and an oscillation circuit in order to oscillate this quartz resonator element.

According to the present invention, a film thickness of the first metal layer before the heat treatment is set to be not less than 20 Å nor more than 45 Å, so that a concentration rise in the chromium to be diffused from the first metal layer into the second metal layer by the heat treatment is suppressed. As a result, an increase in electrical resistance of the electrode constituted by these metal layers is suppressed, and the quartz resonator element having the low CI value compared with that in a conventional art can be formed. Further, it is possible to lower the CI value without increasing a manufacturing cost of the quartz resonator element by setting a thickness of the second metal layer composed of gold or silver to be not less than 500 Å nor more than 950 Å, compared with a method in which a thickness of the first metal layer is left as a conventional thickness and the second metal layer is thickened to suppress the electrical resistance of the electrode low.

DETAILED DESCRIPTION OF THE PREFERRED EMBODIMENT(S)

Hereinafter, a method of manufacturing a quartz resonator element 1 according to the present embodiment and a structure of the quartz resonator element 1 will be explained with reference to FIG. 3 and FIG. 4. The method of manufacturing the quartz resonator element 1 according to the present embodiment has an object to suppress a rise in electrical resistance of each of electrodes 12 to 15 by a heat treatment, and is characterized in that as for a first metal layer composed of chromium and a second metal layer composed of gold or silver, film thicknesses of these thin films in forming the films are adjusted within a predetermined range. Thus, external structures of the quartz resonator element 1 are the same as those explained already by using FIG. 1(a) and FIG. 1(b), and the repeated explanation is omitted. Note that manufacturing processes when gold is used as the second metal layer will be explained below, but manufacturing processes when silver is used as the second metal layer are also almost the same.

Figure 3:
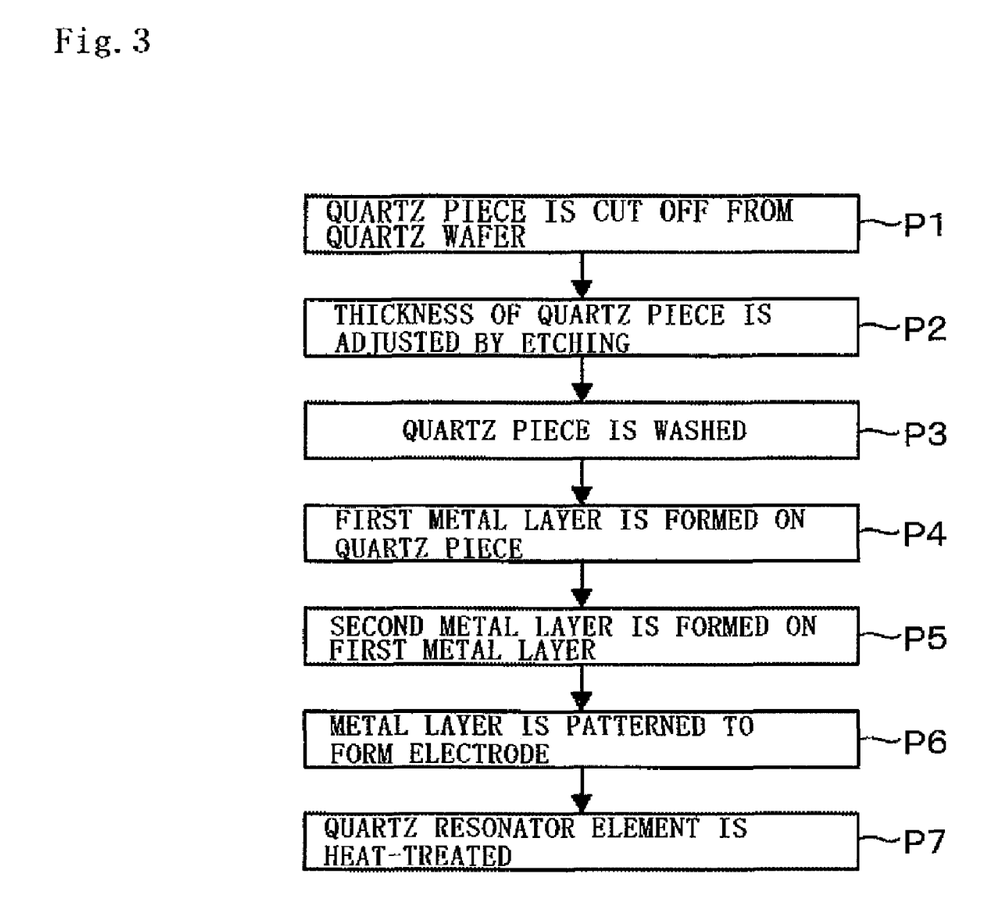
FIG. 3 is a process chart showing manufacturing processes of a quartz resonator element according to the present embodiment.

As shown in FIG. 3, to begin with, a quartz wafer cut out into, for example, a disk shape is cut by a dicing saw, and a large number of quartz pieces 11, which are, for example, 1.4 mm in vertical length and 0.9 mm in horizontal length, are cur off (process P1). Next, each of the quartz pieces 11 that are cut off is individually stored in a small-sized receptacle, and etching by, for example, hydrofluoric acid is performed to adjust a thickness of the quartz piece 11 to a range of 1 μm to 100 μm, for example, 100 μm (process P2). Here, the thickness of the quartz piece in the range of 1 μm to 100 μm also changes according to film thicknesses of the electrodes 12 to 14 to be formed on the quartz piece 11 or the like, but corresponds to an oscillation frequency of approximately 16 MHz to 1670 MHz.

The quartz piece 11 whose thickness is adjusted in this manner has chromium vapor-deposited on entire front and rear surfaces and side surfaces thereof by, for example, sputtering to form the first metal layers whose thickness is not less than 20 Å nor more than 45 Å and is, for example, 30 Å (process P4). Next, the metal to be vapor-deposited on the quartz piece 11 changes to gold to form the second metal layers whose thickness is not less than 500 Å nor more than 950 Å and is, for example, 800 Å on upper surfaces of the first metal layers (process P5).

After the quartz piece 11 is covered by the metal layers with two layers, further, resist films are coated on the second metal layers, and the resist films are exposed to leave portions corresponding to the respective electrodes 12 to 15 shown in FIG. 1(a) and FIG. 1(b), and then, the other portions of the resist films are removed. Then, the quartz piece 11 is immersed in, for example, a potassium iodide solution to remove the second and first metal layers in regions where the resist films are removed, and the excitation electrodes 12 and 13, and the lead electrodes 14 and 15 are formed by patterning (process P6).

Figure 4:
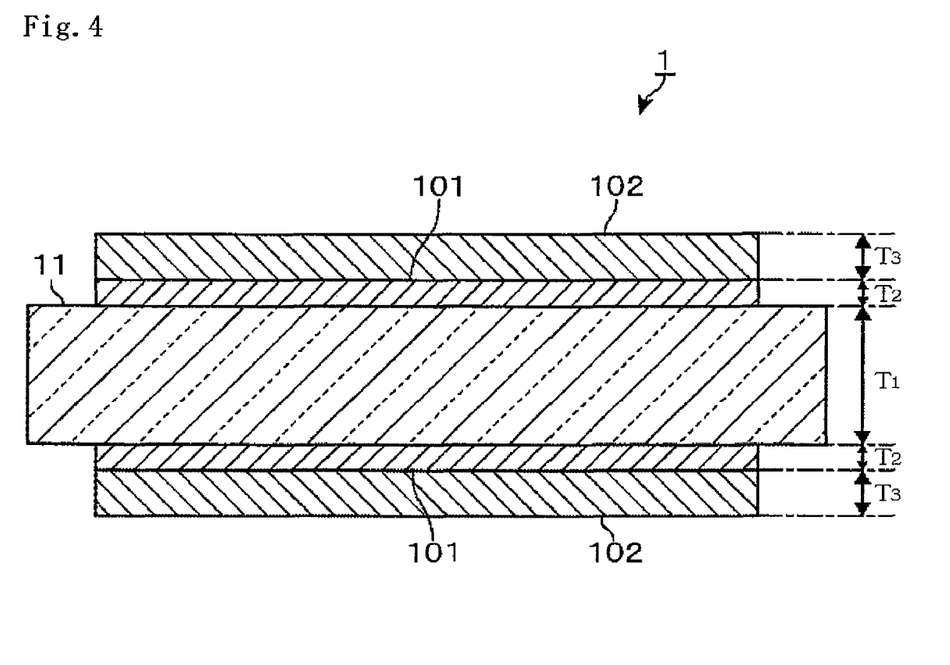
FIG. 4 is a vertical cross-sectional view schematically showing a structure of the quartz resonator element.

According to the above-described processes, as schematically shown in, for example, FIG. 4, the quartz resonator element 1 is obtained, in which first metal layers 101 whose thickness is, for example, 30 Å within a range of, for example, $T_2$=20 Å to 45 Å, and second metal layers 102 whose thickness is, for example, 800 Å within a range of $T_3$=500 Å to 950 Å are stacked in this order on the both surfaces of the quartz piece 11 whose thickness is, for example, 100 μm within a range of, for example, $T_1$=1 μm to 100 μm.

Then, in order to enhance adhesion between the lead electrodes 14 and 15 shown in, for example, FIG. 1(b) and a conductive adhesive 23, the whole quartz resonator element 1 is placed in a heating furnace, and a heat treatment in which the quartz resonator 1 is heated to a temperature of, for example, 300° C. of a temperature range of not less than 200° C. nor more than 400° C. in, for example, a vacuum atmosphere or a nitrogen atmosphere is performed for, for example, 30 minutes to diffuse the chromium of the first metal layers 101 into surfaces of the second metal layers 102 (process P7). The present inventor has confirmed that the thickness of the first metal layers 101 thins further by diffusing the chromium into the second metal layers 102, but sufficient adhesion can be exhibited if the first metal layers 101 before the heat treatment have the thickness of equal to or more than 20 Å.

Here, when the quartz resonator element 1 is heat-treated, there is sometimes a case that residual stress occurs on the quartz resonator element 1 by a thermal history that is made by thermal expansion and shrinkage in cooling of the quartz piece 11 itself, and further, thermal expansion and shrinkage of each of the metal layers 101 and 102 formed on the quartz piece 11. This stress hardly affects a frequency characteristic of the quartz piece 11 if the quartz resonator element 1 has the thickness of, for example, approximately 100 μm as in a conventional art. However, when the quartz resonator element 1 that is thin enough to be approximately equal to or less than 30 μm such as the quartz piece 11 according to the present embodiment is used, an effect of this residual stress cannot be ignored. Here, in the method of manufacturing the quartz resonator element 1 according to the present embodiment, by thinning the film thickness of each of the metal layers 101 and 102 so that the total film thickness of the first and second metal layers 101 and 102 becomes 520 Å to 995 Å, stress exerted on the quartz piece 11 in thermal expansion and shrinkage is lowered compared with that in a conventional film thickness (for example, a film thickness of a first metal layer is approximately 100 Å, a film thickness of a second metal layer is approximately 1000 Å to 3000 Å, and the total is approximately 1100 Å to 3100 Å). As a result, the stress remaining on the quartz piece 11 after the heat treatment becomes small, and it is possible to suppress change of the frequency characteristic of the quartz resonator element 1 made before and after the heat treatment low.

The quartz resonator element 1 manufactured by the above-explained processes is stored in a package 21 by the conductive adhesive 23 as is shown in FIG. 2 to be constituted as a quartz resonator 2. This quartz resonator 2 (the quartz resonator element 1) is combined with a well known oscillation circuit such as, for example, a Colpitts-type oscillation circuit to be used as a quartz oscillator.

According to the method of manufacturing the quartz resonator element 1 related to the present invention, the following effects exist. The film thickness of the first metal layer 101 before the heat treatment is set to be 20 Å to 45 Å, so that a concentration rise in the chromium to be diffused from the first metal layer 101 into the second metal layer 102 by the heat treatment can be suppressed. As a result, an increase in the electrical resistances of the electrodes 12 to 15 constituted by these metal layers is suppressed, and the quartz resonator element 1 having the low CI value can be formed. On the other hand, the electrical resistances of the electrodes can be lowered by setting the thickness of the first metal layer 101 to be approximately 100 Å and setting the thickness of the second metal layer 102 to be 1000 Å. However, this structure has the thick layer composed of gold or silver, so that a manufacturing cost of the quartz resonator element 1 becomes high. On the other hand, by setting the thickness of the second metal layer composed of gold or silver to be 500 Å to 900 Å as described in the present invention, the CI value can be lowered without increasing the manufacturing cost of the quartz resonator element.

Further, the metal layers 101 and 102 thinner than those of the conventional art are formed on the thin quartz piece 11 whose thickness is in the range of 1 μm to 30 μm as is described already, and thereby the stress exerted on the quartz piece 11 in the course of the heat treatment becomes small, and change of the frequency characteristic of the quartz resonator element 1 made before and after the heat treatment can be suppressed by making the residual stress that occurs by, for example a thermal history small.

Figure 5:
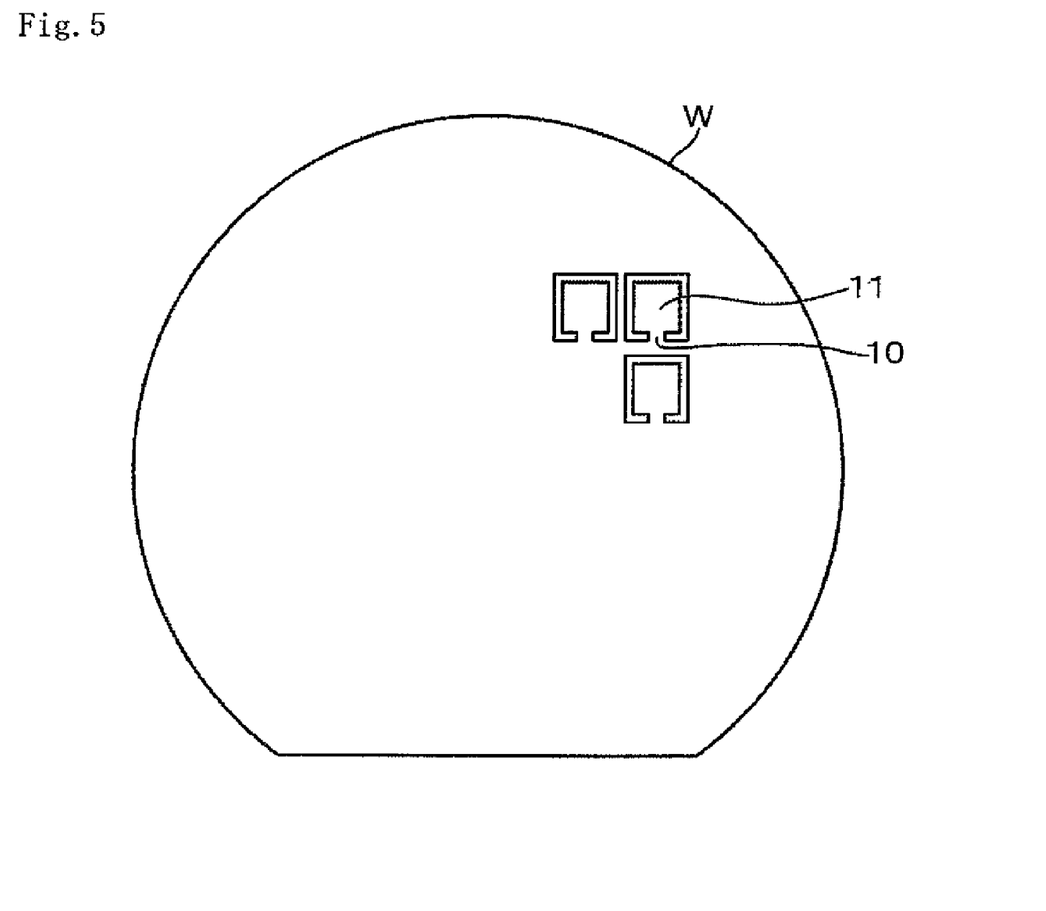
FIG. 5 is an explanatory view according to another method of manufacturing the quartz resonator element.

Here, the method of manufacturing the quartz resonator element 1 is not limited to the case when the quartz resonator element 1 is segmented individually as is described already, and then the first metal layers 101 and the second metal layers 102 are formed. A method may be adopted, in which as is shown in, for example, FIG. 5, a large number of the quartz pieces 11 are formed on a quartz wafer W by, for example, etching while connection portions 10 to the quartz wafer W being left, and thickness adjustment and washing of the quartz pieces 11, forming of each of metal films 101 and 102, forming of each of the electrodes 12 to 15 by etching of these metal films 101 and 102, and the heat treatment are performed in a state when each of the quartz pieces 11 is connected to the quartz wafer W, and after a large number of the quartz resonator elements 1 are formed on the quartz wafer W, each of the quartz resonator elements 1 is cut off. In the case when it is difficult to handle the quartz piece 11 that is cut into a piece individually with miniaturization of the quartz piece 11, a large number of the quartz pieces 11 in a state of being connected to the quartz wafer W are processed collectively, and thereby, the even quartz resonator element 1 in which unevenness in the thicknesses of the quartz piece 11 and the metal layers 101 and 102 does not appear in each piece can be manufactured. Note that in FIG. 5, only the three quartz pieces 11 are shown representatively with regard to the state where the quartz piece 11 is formed, but practically, a large number of the quartz pieces 11 are formed on, for example, an entire surface of the quartz wafer W.

What is claimed is:

1. A method of manufacturing a quartz resonator element in which a thin film-shaped electrode is formed on a plate-shaped quartz piece to excite the quartz piece, the method comprising:

forming a first metal layer that is composed of chromium and whose thickness is not less than 20 Å nor more than 30 Å on the surface of the plate-shaped quartz piece, the plate-shaped quartz piece being AT cut;

forming a second metal layer that is composed of gold or silver and whose thickness is not less than 500 Å nor more than 950 Å on an upper surface of the first metal layer, and wherein said thin film-shaped electrode is made up of the first metal layer and the second metal layer; and heating the plate-shaped quartz piece on which the electrode is formed to a temperature range of not less than 300° C. nor more than 400° C., and diffusing the chromium composing the first metal layer into the second metal layer.

2. The method of manufacturing the quartz resonator element according to claim 1, wherein a thickness of the quartz piece is not less than 1 μm nor more than 100 μm.

3. The method of manufacturing the quartz resonator element according to claim 2, wherein the thickness of the quartz piece is not less than 1 μm nor more than 30 μm.

4. The method of manufacturing the quartz resonator element according to claim 2, wherein the oscillation frequency of the quartz piece is not less than 16 MHz nor more than 1670 MHz.

5. A quartz resonator element manufactured by the method according to claim 1.

6. A quartz resonator comprising: a receptacle in which the quartz resonator element according to claim 5 is closed airtightly; and a terminal portion provided on an outside of said receptacle and connected to the electrode electrically.

7. A quartz oscillator comprising: the quartz resonator element according to claim 5; and an oscillation circuit in order to oscillate said quartz resonator element.

8. The method of manufacturing the quartz resonator element according to claim 1, wherein the thickness of the second metal layer is not less than 800 Å nor more than 950 Å.

\* \* \* \* \*